United States Patent
Shakir et al.

(10) Patent No.: US 10,331,811 B2
(45) Date of Patent: Jun. 25, 2019

(54) SYSTEM AND MODEL FOR REAL-TIME PREDICTIVE LASER BEAM PROPAGATION

(71) Applicant: Tau Technologies, LLC, Albuquerque, NM (US)

(72) Inventors: Sami A. Shakir, Albuquerque, NM (US); Richard A. Carreras, Albuquerque, NM (US)

(73) Assignee: TAU TECHNOLOGIES, LLC, Albuquerque, NM (US)

( * ) Notice: Subject to any disclaimer, the term of this patent is extended or adjusted under 35 U.S.C. 154(b) by 736 days.

(21) Appl. No.: 14/811,270

(22) Filed: Jul. 28, 2015

(65) Prior Publication Data

US 2016/0034618 A1    Feb. 4, 2016

Related U.S. Application Data

(60) Provisional application No. 62/030,998, filed on Jul. 30, 2014.

(51) Int. Cl.
*G06F 17/50*    (2006.01)

(52) U.S. Cl.
CPC ................ *G06F 17/5009* (2013.01)

(58) Field of Classification Search
CPC .................................. G06F 17/5009
See application file for complete search history.

(56) References Cited

U.S. PATENT DOCUMENTS

| | | | | |
|---|---|---|---|---|
| 6,052,180 A | * | 4/2000 | Neal | G01J 9/00 250/201.9 |
| 2004/0179848 A1 | * | 9/2004 | Belenkii | H04B 10/112 398/131 |
| 2009/0028198 A1 | * | 1/2009 | Belenkii | G02B 27/52 372/33 |
| 2009/0051902 A1 | * | 2/2009 | Widen | G01J 1/4257 356/73 |
| 2010/0192709 A1 | * | 8/2010 | Wilcox | G06F 17/5009 73/865.6 |
| 2010/0232007 A1 | * | 9/2010 | Byren | F41H 13/005 359/291 |

OTHER PUBLICATIONS

Sami Shakir et al, Efficient matrix approach to optical wave propagation and Linear Canonical Transforms, Optics Express vol. 23, No. 20 Oct. 2015 p. 1-10.*

(Continued)

*Primary Examiner* — Rehana Perveen
*Assistant Examiner* — Chuen-Meei Gan
(74) *Attorney, Agent, or Firm* — Lewis Roca Rothgerber Christie LLP (57) ABSTRACT

The present invention is a method for real-time predictive laser beam propagation through various atmospheric conditions and over predetermined distances. The invention includes loading input parameters into an embedded control scheme of a laser system. A prediction of one or more laser beam parameters is generated and a computational error is quantified for the generated laser beam parameters. One or more parameters for the laser system are then chosen based on the prediction and based on the quantified computational error. The chosen parameters are within a predetermined tolerance. A laser system is then built or adjusted using the one or more chosen parameters.

20 Claims, 4 Drawing Sheets

(56) References Cited

OTHER PUBLICATIONS

Paul Hickson, Fundamentals of Atmospheric and Adaptive Optics, The University of British Columbia, Jun. 1, 2008, p. 1-68.*
Press et al, Numerical Recipes, Cambridge, 2007. p. 1-1262.*
Schmidt et al, Numerical simulation of optical wave propagation with examples in MATLAB, SPIE 2010. p. 1-203.*
Lars Sjoqvist et al, Simulation of laser beam propagation over land and sea using phase screens—a comparison with experimental data, Proceeding of SPIE—The internation scociety for optical engineering. Nov. 2005. p. 1-12.*

* cited by examiner

SYSTEM AND MODEL FOR REAL-TIME PREDICTIVE LASER BEAM PROPAGATION

CROSS-REFERENCE TO RELATED APPLICATIONS

This application claims the priority benefit of U.S. provisional application No. 62/030,998, entitled "A System and Model for Real-Time Predictive Laser Beam Propagation," filed on Jul. 30, 2014, the disclosure of which is incorporated herein by reference.

STATEMENT REGARDING FEDERALLY SPONSORED RESEARCH OR DEVELOPMENT

This invention was made with Government support under W9113M14C0005 awarded by U.S. Army Space and Missile Defense Command/Army Forces Strategic Command (USASMDC/ARSTRAT). The Government has certain rights in the invention.

BACKGROUND

Field of the Invention

Embodiments of the present invention relate to laser systems, and particularly to long-range, high-energy laser systems. More particularly, embodiments of the present invention relate to a system and method for generating and realizing real-time predictions of laser beam parameters for propagation through various atmospheric conditions and over extended distances.

Description of Related Art

A great deal of effort has been expended to produce efficient and effective laser systems capable of predicting how physical processes affect the propagation of long-range, high-energy lasers in air. Conventional systems and models for predicting and realizing parameters for laser beam propagation, however, have remained either slow, inaccurate, or both. The poor efficacy of these systems and models are often a result of inadequate embedded scalar optical wave control schemes. Currently, control schemes for scalar optical wave propagation are generally approached in one of three forms. One form is the differential form, as represented by the Helmholtz wave equation. A major drawback of this control scheme, however, is that few cases can be solved analytically with this formulation. More generally, one has to discretize the problem for numerical implementation. Further drawbacks are that coding can be challenging and accuracy is difficult to quantify. A second form is integral representation, which has been formulated in different forms, such as the Rayleigh-Sommerfeld formulation and the Fresnel-Kirchhoff formulation. These integral formulations are based on a Green's function solution of the Helmholtz wave equation. The integral form offers the advantage of the mathematical and physical insight and methods of linear systems, such as the Fast Fourier Transform (FFT) approach to solving convolution type integrals. The FFT approach involves transforming the equation from the spatial domain to the frequency domain, where some operations are simpler, and transforming back, after solving the problem in the frequency domain. This transformation may introduce some artifacts due to sampling and aliasing, and as a result add artifacts to the solution. Therefore, a major inadequacy of this control scheme is that results are likely to be corrupted by the artifacts and quantifying the accuracy is quite challenging. A third approach to wave propagation is in terms of the direct solution of Maxwell's equations. This formulation is convenient for problems dealing with waveguides of different geometries, but most cases do not fall into that category. This approach has generally been shown to be slow and inaccurate.

Thus, there is a need in the art for improved systems and models for obtaining and realizing fast and accurate prediction parameters for laser beam propagation.

SUMMARY

One embodiment of the present invention is a system and model for real-time predictive laser beam propagation through various atmospheric conditions and over extended distances. This system utilizes one or more laser system components. One of the laser system components is a laser beam. The laser system components are then initiated. The laser beam is then allowed to propagate through at least one atmospheric condition over a predetermined distance. One or more input parameters are then sent from a sending terminal to a receiving terminal in the laser system. The receiving terminal then loads the input parameters into an embedded control scheme of the laser system. A prediction of one or more laser beam parameters is then generated and a computation error for the generated laser beam parameters is quantified. One or more parameters for the laser system are chosen by the control scheme based on the prediction and based on the quantified computational error. The control scheme then determines whether one or more parameters are within a predetermined tolerance, and, if so, one or more chosen output parameters are encoded into the sending terminal of the control scheme. The one or more output parameters can be instantaneous Power-In-Bucket (PIB) ratios, instantaneous Strehl Ratios, instantaneous peak irradiance, instantaneous wave front profile, temporal and spatial statistical properties of phase, amplitude and of the generalized complex field for the propagated laser beam. A message encoded with one or more output parameters is then relayed over a communications channel to the receiving terminal of the laser system and the laser system components are then adjusted accordingly. A laser system can then be modified, designed and/or built using the one or more output parameters.

Another embodiment of the present invention is a method for designing, developing and testing a laser system. The method includes providing one or more laser system components including a laser beam and initiating the laser system components using one or more user input parameters. The input parameters are specified by a user. The laser beam is then allowed to propagate through at least one atmospheric condition over a predetermined distance. The one or more input parameters are then sent to a receiving terminal of a communication channel. The one or more input parameters are then loaded into an embedded control scheme of the laser system preferably through an input menu on a user display screen. The method then generates a prediction of one or more laser beam parameters, optionally based on a paraxial approximation. The embedded control scheme can include a scalar Fresnel diffraction integral. A computational error is then quantified for the generated laser beam parameters. One or more parameters are then chosen for the laser system based on the prediction and based on the quantified computational error. The one or more parameters are within a predetermined tolerance, such as, for example, a predetermined tolerance for power or laser spot size. A laser system is then built using the one or more chosen parameters.

The one or more parameters can include instantaneous power-in-the-bucket ratios, instantaneous Strehl Ratios, instantaneous peak irradiance, instantaneous wave front profile, and temporal and spatial statistical properties of phase, amplitude and of the generalized complex field for the propagated laser beam. The atmospheric condition can include an atmospheric coherence length and an isoplanatic angle and the atmospheric condition includes a Greenwood frequency. Quantifying a computation error step can occur in real time.

One method includes relaying a message encoded with the one or more parameters over a communication channel to a receiving terminal of the laser system. Another method includes adjusting the laser system components based on the one or more parameters. The laser beam can propagate through a plurality of atmospheric conditions or through a plurality of points and planes. The choosing of one or more parameters for the laser system based on the prediction and based on the quantified computational error step can occur in real time. The communication channel can be a broad-band cable with modular and demodular equipment.

DETAILED DESCRIPTION

An object of the present invention is to improve both the speed and accuracy for obtaining and realizing predictions of laser beam parameters within a laser system. A further object of the present invention is to provide better performance and reduced complexity of a laser system for a user. In one embodiment of the present invention, an embedded control scheme handles propagation problems that typically require a large sampling array because of the highly oscillatory nature of the propagation kernel. In this embodiment of the present invention, the control scheme can handle these scenarios without loss of accuracy and with an increased performance in speed as compared to conventional laser systems and models.

Given a choice of parameters for a propagation problem, one embodiment of the present invention can quantify the accuracy of a calculation without performing propagation calculations. Alternative forms of the present invention may utilize a large number of Central Processor Units (CPUs) operating concurrently in order to shorten the processing time of the propagation problem.

Figure 4:
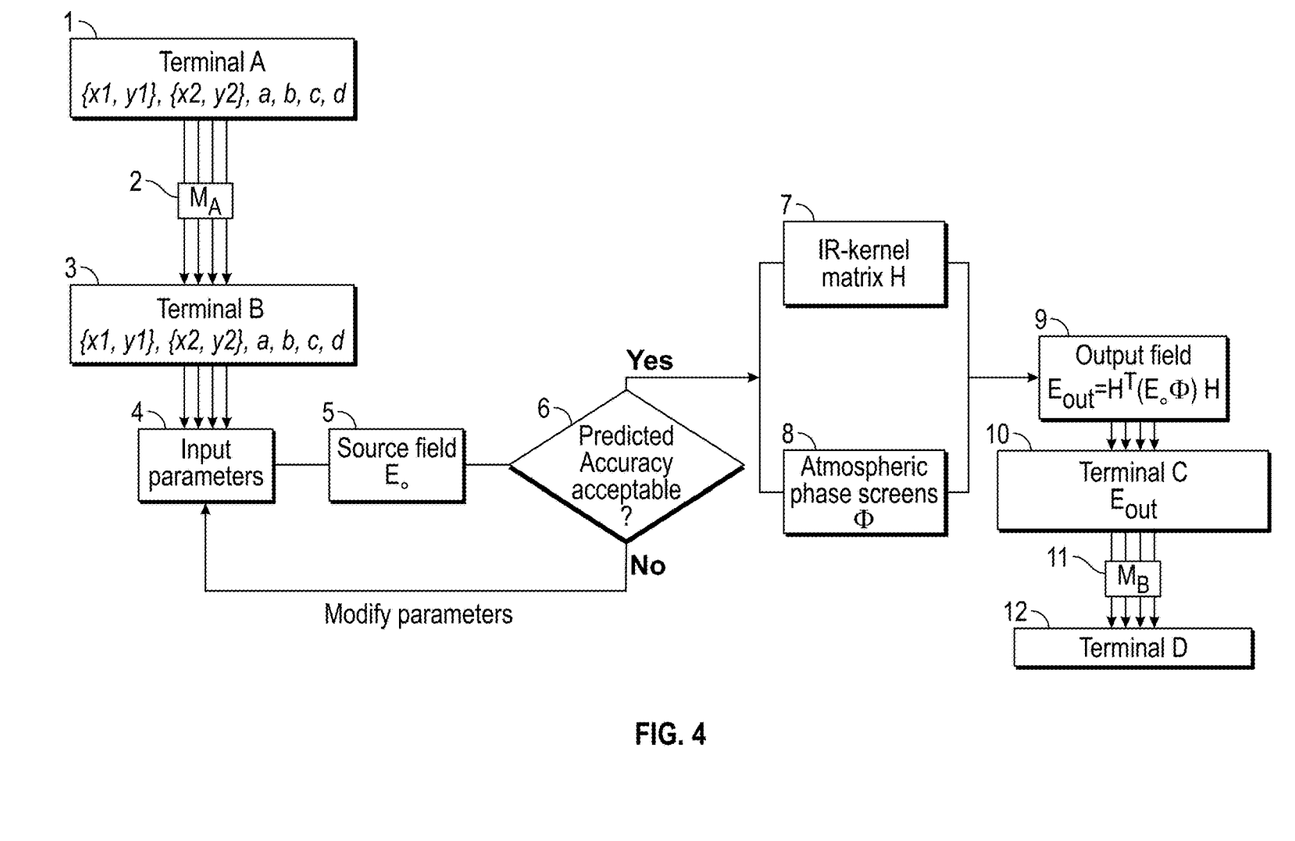
FIG. 4 illustrates a block diagram of one embodiment of the present invention.

FIG. 4 is a flow chart of one embodiment of the present invention that includes a communications channel 2 between terminals A 1 and B 3. The communications channel 2 between terminal A 1 and terminal B 3 may include, for example, a broad-band cable with associated modular and demodular equipment at the various terminals to permit data transfers between terminals connected to the channel and the channel itself. The communication channel 2 between terminals A 1 and B 3 of FIG. 4 is suitable for one-way transfer of messages between terminal A 1 and terminal B 3. In one embodiment of the present invention, terminal A 1 is adapted to transform a message from plaintext into binary form and to communicate that message in binary form, and terminal B 3 is adapted to receive and reconstitute the message into plaintext form. In FIG. 4, the message transferred between terminal A 1 and terminal B 3 is represented by the symbol $M_A$.

Figure 1:
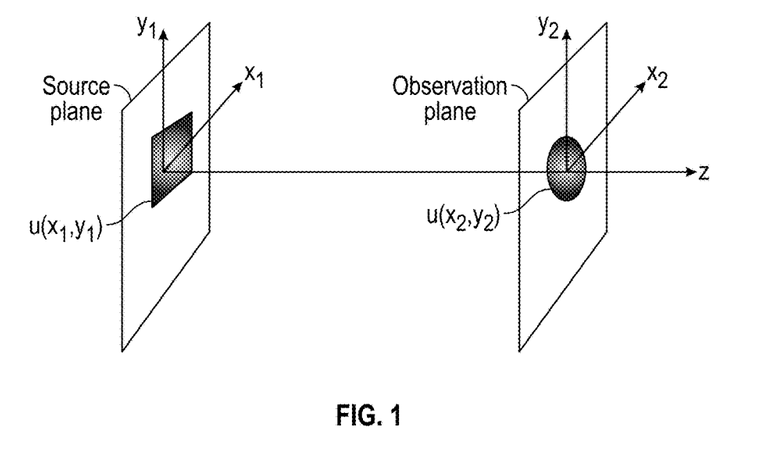
FIG. 1 illustrates a graph of a system being influenced by a linear canonical transform.

Message $M_A$ is encoded with input parameters 4 $\{x_1,y_1\}$, $\{x_2,y_2\}$, and $\{a,b,c,d\}$ by the sending terminal A 1, where the transverse coordinates in the input (or source) plane at distance z=0, and the output (or observation) plane, at z, are $\{x_1,y_1\}$ and $\{x_2,y_2\}$, respectively, as shown in FIG. 1. The field in the source (input) plane is $u(x_1,y_1)$ and in the output plane is $U(x_2,y_2)$, and the parameters $\{a, b, \text{and } d\}$, are the elements of a 2×2 "abcd" matrix that satisfies, ad−bc=1, as illustrated in FIG. 1 and FIG. 4.

After the message $M_A$ is received by the receiving terminal B, the message is then reconstituted by terminal B 3 and the input parameters 4 are then loaded into an embedded Source Field control scheme 5, as demonstrated by FIG. 4. The embedded Source Field control scheme 5 utilizes a scalar Fresnel diffraction integral within its architecture, which is an approximation of the integral formulation of the Helmholtz wave equation, under the assumption of propagation within a narrow angle. This is referred to as the paraxial approximation. The free-space Fresnel diffraction integral can be cast in a form that applies to any paraxial optical element or a more complex composite paraxial system as long as they can be represented by a paraxial optical ABCD-matrix. In two transverse dimensions, this integral can be expressed in a form that represents a broad class of linear transforms called Linear Canonical Transform (LCT). As indicated in FIG. 4, after terminal B 3 loads $M_A$ into the embedded Source Field control scheme 5, $M_A$ is then transformed into $U(x_2,y_2)$ in accordance with:

$$U(x_2, y_2) = \frac{1}{ib} \int_{-\infty}^{\infty}\int_{-\infty}^{\infty} u(x_1, y_1) e^{i\frac{\pi}{b}[(ax_1^2 - 2x_1 x_2 + dx_2^2) + (ay_1^2 - 2y_1 y_2 + dy_2^2)]} dx_1 dy_1 \quad (1)$$

The choice of these elements results in reducing eq.(1) in an integral transform such as the Fourier, Fractional Fourier, free-space Fresnel, ABCD-system Fresnel, Laplace, Fractional Laplace, and Gauss-Weierstrass transform. FIG. 1 illustrates a graph of a system being influenced by a Linear Canonical Transform.

As illustrated in FIG. 4, the source field 5, $u(x_1,y_1)$ is then transformed by the embedded control scheme into an observation field $U(x_2,y_2)$, in the observation plane a distance z from the source plane. As shown in FIG. 4, the choice of elements and the corresponding integral transform are generated as summarized in Table 1 below. Once the embedded control scheme 5 has been run and if the predicted accuracy is acceptable at 6, then IR-Kernel matrix H and atmospheric phase screens 8 produce output field 9.

For both numerical computation and analysis purposes, the embedded control scheme transforms eq.(1) in terms of a matrix transformation in accordance with:

$$U = H^T u H \quad (2)$$

and the corresponding inverse problem as, $$u = H^* U H^{*T} \quad (3)$$

where u is the discrete form of the input field and is a matrix of dimensions $N_1 \times N_1$ while U is the discrete form of the output fields and is a matrix of dimensions $N_2 \times N_2$. Without the loss of generality, for convenience, it is assumed that the x and y transverse grid points are similar. It is useful to note that the grid spacing does not have to be equal, an observation that may be useful for problems where one wants to focus on certain regions but not others. The matrix H is the discrete form of the quadratic phase kernel in eq.(1) and (*) represent the complex conjugate while (T) represent the matrix transpose operation.

The matrix H is of dimension $N_1 \times N_2$ and is defined by, $$H_{j1,j2} = W_{j1} \frac{1}{\sqrt{ib}} e^{i\frac{\pi}{b}(ax_{j1}^2 - 2x_{j1}x_{j2} + dx_2^2)} \quad (4)$$

where the weight coefficient $W_{j1}$ represent the coefficients employed in discrete integration algorithms. For an equally spaced mesh of grid points with grid separation of D in both the x and y direction; the extended Trapezoidal Rule algorithm requires, $W_j = (0.5, 1, 1, \ldots 0.5)\Delta$, and for a more accurate extended Simpson's Rule algorithm, we have, $W_j = (1, 4, 2, 4, 2 \ldots 4, 1)\Delta/3$. In effect, eq.(2) transforms a discrete field distribution of size $N_1 \times N_1$ at a source plane at z=0 into a discrete field distribution of size $N_2 \times N_2$ at an observation plane at z.

As illustrated by FIG. 4, a communications channel 11 between terminals C 10 and D 12. The communications channel 11 between terminal C 10 and terminal D 12 may include, for example, a broad-band cable with associated modular and demodular equipment at the various terminals to permit data transfers between terminals connected to the channel and the channel itself. The communication system between terminals C 10 and D 12 of FIG. 4 is suitable for the one-way transfer of messages between terminal C 10 and terminal D 12. In one embodiment of the present invention, terminal C 10 is adapted to transform a message from plaintext into binary form and to communicate that message in binary form and terminal D 12 is adapted to receive and reconstitute the message into plaintext form.

After the output field 9 is generated by the embedded control scheme 5, it is then loaded into the sending terminal C 10. As shown by FIG. 4, terminal C 10 then encodes the output field 9 and transfers it to terminal D 12 by way of the communication channel 11. In FIG. 4, the message transferred between terminal C 10 and terminal D 12 is represented by the symbol $M_B$.

The proof of eq.(2) is based on the recognition that the Fresnel diffraction integral convolution kernel is separable in spatial coordinates {x and y} which results in $$\int_{-\infty}^{\infty}\int_{-\infty}^{\infty} u(x_1, y_1) e^{i\frac{\pi}{\lambda z}[(x_n - x_1)^2 + (y_m - y_1)^2]} dx_1 dy_1 = \quad (5)$$

$$\Delta^2 \sum_{j=1}^{N} W_j e^{i\frac{\pi}{\lambda \Delta z}(y_m - y_j)^2} \sum_{k=1}^{N} W_k e^{i\frac{\pi}{\lambda \Delta z}(x_n - x_k)^2} u_{j,k}$$

where $x_k = k\Delta$, and $y_j = j\Delta$; while k and j are integers, $j,k = 1, 2, \ldots N_1$. Eq.(1) can be cast into the form of eq.(2). Note the freedom in choosing the number of grid points in either the source plane and observation plane so that they do not have to be equal. The grid spacing can also be chosen differently for either plane. The accuracy of the field at the observation plane may depend on the grid spacing size in the source plane, but not on the grid spacing in the observation plane.

In another embodiment of the present invention, an efficient matrix multiplication algorithm can be used instead of wave propagation methods based on the Fast Fourier Transform (FFT). The inherent flexibility of choosing a different number of points for the input and output planes can give an embodiment of the present invention a speed advantage over FFT-based methods for cases where only a small number of solution points are of interest in the output plane.

An advantage of an embodiment of the present invention is the capacity to quantify the truncation errors for a given choice of parameters, such as the grid size and number of sample points. This error can be quantified by noting that eq.(2) may be based on numerical quadratures and the errors may be truncation errors. This assumes that the integration limits are large enough to encompass all regions where the field is significant. Hence, if the weight factor (W) in eq.(4) represent the Trapezoidal Rule, then the truncation error for 2D problems is given by, $$R \leq \frac{L^4}{12 N^2 \lambda z} \max_{\xi, \eta \in L} |\nabla_T^2 f(\xi, \eta, x_2, y_2)| \quad (6)$$

where $$f(x, y; x', y') = u(x, y) e^{i\frac{\pi}{b}[(ax^2 - 2xx' + dx'^2 + (ay^2 - 2yy' + dy'^2)]} \quad (7)$$

N is the linear grid size in pixels, and L is the total integration length, with the limits of integration being ($\pm L/2$). Equations (6) shows how the truncation error is proportional to the square of the area of the computation window ($L^2$) and inversely with the square of the grid size. Furthermore, the formula shows how the truncation error term depends on the rate of change of the product of the field and the kernel, and not the field alone. In addition to giving insight into the dependency of the error term, this embodiment also provides a way to choose parameters to keep the error within predetermined tolerances. The expressions also show that the error term does not depend on size of the observation window, which is not the case for FFT based methods.

FFT based methods derive their speed advantage over other methods from the fact that its computational complexity is of the order $O(N \log_2(N))$, where N is the linear number of grid points. Since matrix multiplication of two matrices, each of size N×N, involves computational complexity of order $O(N^3)$, then FFT based methods have a speed advantage. While this is true for 1D problems, the situation is more involved for higher dimensions, especially if a "fast" matrix multiplication algorithm is used. In fact, matrix multiplication can be of order $O(N^\beta)$ where $2.35 < \beta < 3$, depending on the algorithm used. Hence, for M-dimensional (M=1,2) LCTs, the number of multiply operations increases linearly with the dimension M, as $O(M N^\beta)$, while it increases exponential for the FFT based methods, as $O(N^M \log_2(N^M))$. To compare the speeds more accurately than just order of magnitude estimates, an embodiment of the present invention and an FFT based wave propagation were both applied on several problems, ranging from a simple tilted Gaussian beam to an array propagation in the atmosphere to compare the speed and accuracy of the two approaches.

In one non-limiting example, an FFT based propagator was used, such as the one in ref.(13), which involves three FFT operations and one element by element multiplication of two arrays. The ratio of the time taken for the FFT method to that of an embodiment of the present invention is approximately given by $$\text{Speed} \approx c \frac{1 + 3\log_2(N^2)}{N^{0.8}} \quad (8)$$

where it was assumed that the matrix multiplication algorithm is using the Strassen algorithm which results in β=2.8. The proportionality factor c of eq.(8) depends on the propagation method used and the computation platform and was set to two for the platform used. In the results of this example shown in FIG. 2, MATLAB was used to run the wave propagation code. MATLAB employs the Strassen algorithm for matrix multiplication, and uses optimized FFT routines for FFT calls. In this example, the computation was repeated about 100 times and the time taken was averaged over the about 100 times on a four-cores PC machine based on Windows platform and Linux platform, with similar results. For reference, the expected speed for the so called "naive multiply" (β=3), and the Coppersmith-Winograd algorithm (β=2.4) is also shown. As the curves show in FIG. 2, the method of an embodiment of the present invention is significantly faster than the FFT based wave propagator for linear N<300, but losses that advantage as N becomes larger than 300.

In one embodiment of the present invention, there is no restriction on the number of points in the observation plane. In fact it can be as small as a single point. This level of flexibility offers a speed advantage that can be as large as two or three order of magnitude for problems where one is interested in a single point or a small region in the observation plane. This situation can be common in situations where a user is interested in metrics, such as the Strehl, and the Power-In-The-Bucket (PIB) estimates. This is in contrast to FFT based methods where the number of points have to be the same for input and output planes. The representation of eq.(1) in terms of the matrix form of eq.(2) offers a simple operational form that may simplify the analysis of complex systems in a way similar to the operational approach to optical systems. Moreover, the matrix formalism may provide the opportunity to employ the wealth of matrix mathematical methods developed in fields as diverse as image processing and quantum mechanics. For example, eq.(3) is a relatively simple way to express the inverse diffraction problem and is developed from eq.(2) in a relatively simple way.

Referring to FIG. 4, problems involving apertures and phase screens that are separable in x and y can be included in the kernel H to form an effective kernel. A rectangular aperture is an example of a separable aperture.

Figure 2:
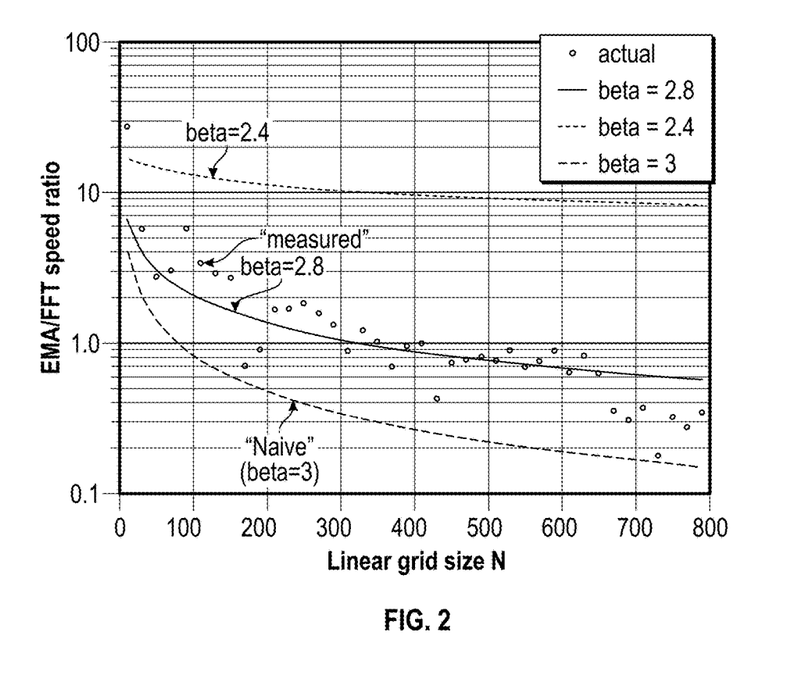
FIG. 2 illustrates a graph of a speed ratio for an embodiment of the present invention over existing methods based on Fast Fourier Transform (FFT) wave-propagators. Solid circles represent results from an example of actual simulation components.
Figure 3A:
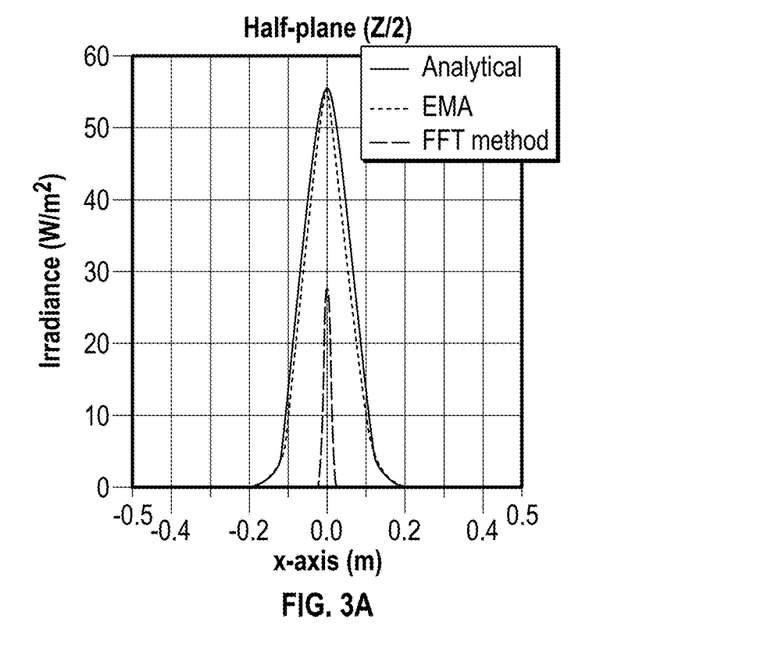
FIGS. 3A-3B illustrate graphs of a Gaussian beam that is propagated through the atmosphere to a target.
Figure 3B:
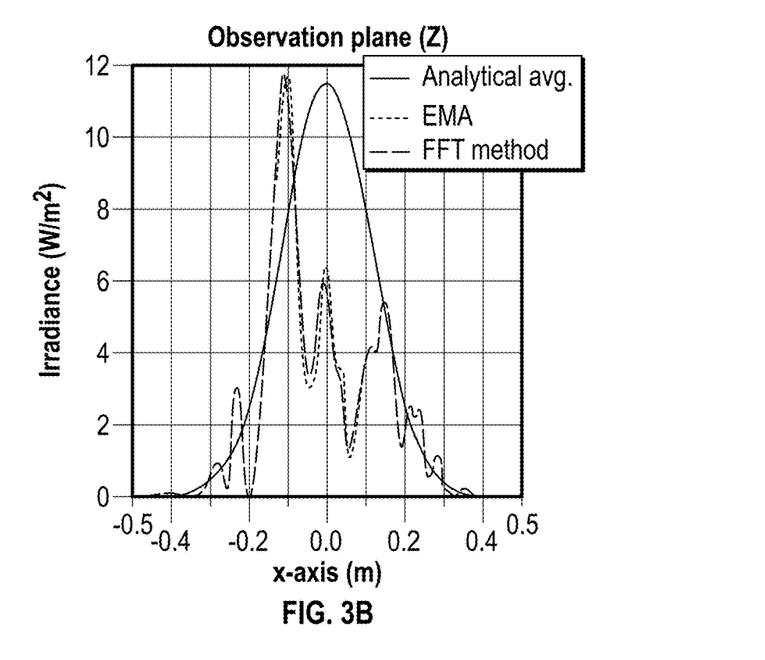
Figure 3C:
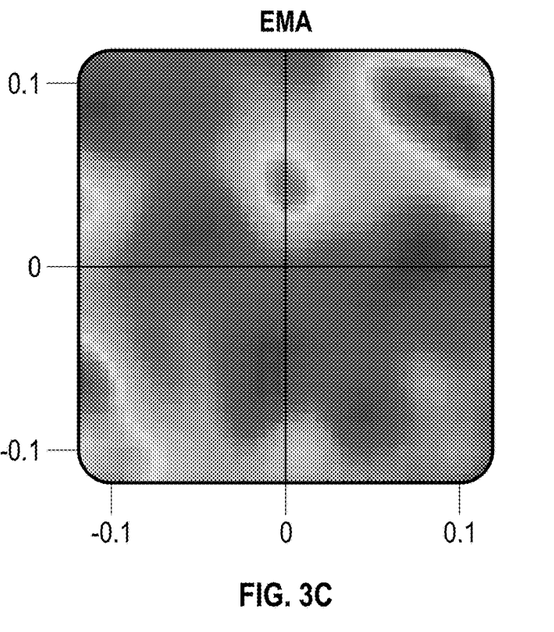
FIGS. 3C-3D illustrate images of the Gaussian beam of FIGS. 3A and 3B calculated using Exponential Moving Average (EMA) and FFT examples.
Figure 3D:
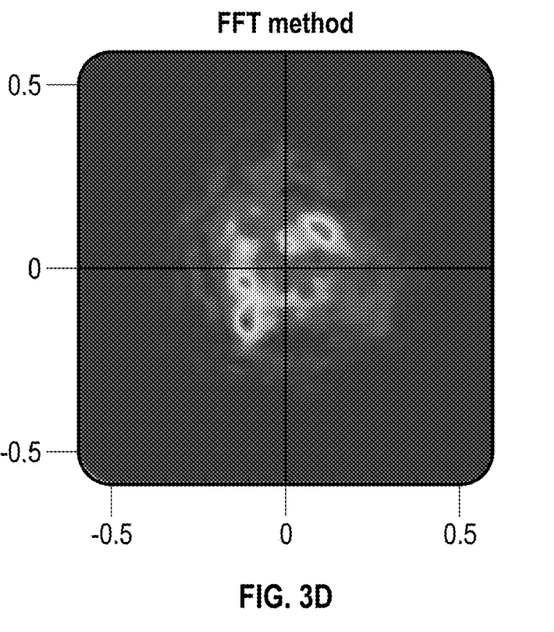

The sampling requirements dictate the grid size and the number of grid points in the input plane but not the output plane. Hence, in contrast to FFT based methods that require the field to be zero at the output plane boundaries, there is no such requirement for embodiments of the present invention. FIG. 2 is a graph showing a speed ratio for an embodiment of the present invention over FFT wave-propagator. Solid circles represent actual simulation using MATLAB. The solid line is the formula of eq.(8) for Speed=2.8. The dashed line is for Speed=2.4, and the broken line for Speed=3. FIGS. 3A-3D show examples of a Gaussian beam that is propagated through the atmosphere to a target that is about 10 km away. In these examples, there is an about 1-micron wavelength beam waist radius of about 1.5 cm, first propagated a distance of about 5 km (FIG. 3A), then an atmospheric equivalent phase screen ($r_0$=5 cm) is applied and the modified beam is propagated another about 5 km (FIG. 3B). The two-dimensional beam at 10 km is shown as EMA calculated (FIG. 3C), and FFT calculated (FIG. 3D).

Two FFT based propagation implementations were used and well-tested commercial packages to check the results. In terms of accuracy and robustness regarding aliasing problems, the method of the present invention proved more accurate and much less prone to aliasing problems. One reason for this accuracy is due to sampling requirements in the spatial domain only while FFT algorithms have to satisfy that in both space and phase domains.

Embodiments of the present invention include a method for casting an integral form of a general Linear Canonical Transforms (LCT) in a matrix transformation form that is useful for analytical purposes and is an efficient computational tool that is superior to FFT based methods when the linear grid samples are N<300.

TABLE 1

| Linear Canonic Transforms | | | | | | |
|---|---|---|---|---|---|---|
| Free-space Fresnel | ABCD Fresnel | Fourier Transform | Fractional Fourier T. | Laplace Transform | Fractional Laplace T. | Gauss-Weierstrass |
| $\begin{bmatrix} 1 & \lambda z \\ 0 & 1 \end{bmatrix}$ | $\begin{bmatrix} A & B \\ C & D \end{bmatrix}$ | $\begin{bmatrix} 0 & 1 \\ -1 & 0 \end{bmatrix}$ | $\begin{bmatrix} \cos\theta & \sin\theta \\ -\sin\theta & \cos\theta \end{bmatrix}$ | $\begin{bmatrix} 0 & i \\ -i & 0 \end{bmatrix}$ | $\begin{bmatrix} i\cos\theta & i\sin\theta \\ i\sin\theta & i\cos\theta \end{bmatrix}$ | $\begin{bmatrix} 1 & -i4\pi \\ 0 & 1 \end{bmatrix}$ |

Embodiments of the present invention provide better performance and reduced complexity for a user than. The system for real-time predictive laser beam propagation of the present invention can handle propagation problems that normally require a large sampling array because of the highly oscillatory nature of the propagation kernel. Embodiments of the present invention offer a capability to quantify the computational error for a given set of parameters before actual solution of a propagation problem. This may be critical for applications where a certain level of accuracy is required. A method offers an advantage of flexibility in choosing the number of grid points in input plane and output plane. Furthermore, the method is also flexible in choosing the size of computational window for input and output planes. This can be of advantage for problems involving Strehl estimation or Power-In-the Bucket (PIB) computation, and lead to order of magnitude gain in speed over FFT based propagators. Furthermore, in the method, the mesh size need not be equal, which may be of advantage in problems where the field is known to concentrate. One method can improve direct solution of the Fresnel diffraction integral which is normally avoided because of a perception of speed disadvantage. In one dimension, the FFT based methods are proportional to (N log N), where N is the linear dimension. For M-dimensions (M=1,2), it becomes ($N^M$ log $N^M$). Unlike FFT based methods, there is no boundary value issues with embodiments of the present invention (no reflection at the boundaries). Since it is matrix based, embodiments of the present invention are ideally suited for parallel processing. Embodiments of the present invention offer an elegant and simple matrix-based formalism, that may help in simplifying analytical solutions of complex problems. For example, the direct propagation is simply; $U=H^T$ u H, and Inverse problem: $u=H^{*T}$ U $H^*$.

The foregoing detailed description of the technology has been presented for purposes of illustration and description. It is not intended to be exhaustive or to limit the technology to the precise form disclosed. Many modifications and variations are possible in light of the above teaching. The described embodiments were chosen in order to best explain the principles of the technology, its practical application, and to enable others skilled in the art to utilize the technology in various embodiments and with various modifications as are suited to the particular use contemplated. It is intended that the scope of the technology be defined by the claim.

What is claimed:

1. A method for designing, developing and testing, and building or modifying, a new or existing physical laser system based on prediction results and quantified computational error, the method comprising:
   providing one or more laser system components, wherein one of the one or more laser system components is a laser beam generator;
   initiating the laser system components using one or more user input parameters comprising translation coordinates in a source plane and in an observation plane;
   propagating a laser beam through at least one atmospheric condition over a predetermined distance;
   sending the one or more user input parameters over a communication channel to a receiving terminal of the laser system;
   loading the one or more user input parameters into an embedded control scheme of the laser system;
   generating a prediction of one or more laser beam parameters;
   quantifying computational error to generate the quantified computational error for the generated prediction of the one or more laser beam parameters by casting an integral form of a general Linear Canonical Transforms (LCT) in a matrix transformation form;
   choosing one or more parameters for the laser system based on the prediction of the one or more laser beam parameters and based on the quantified computational error, wherein the one or more chosen parameters are within a predetermined tolerance; and
   building the laser system using the one or more chosen parameters.

2. The method of claim 1 wherein the one or more chosen parameters include instantaneous power-in-the-bucket ratios.

3. The method of claim 1 wherein the one or more chosen parameters include instantaneous Strehl Ratios.

4. The method of claim 1 wherein the one or more chosen parameters include instantaneous peak irradiance.

5. The method of claim 1 wherein the one or more chosen parameters include instantaneous wave front profile.

6. The method of claim 1 wherein the one or more chosen parameters include temporal and spatial statistical properties of phase, amplitude and of a generalized complex field for the propagated laser beam.

7. The method of claim 1 wherein the atmospheric condition includes an atmospheric coherence length.

8. The method of claim 1 wherein the atmospheric condition includes an isoplanatic angle.

9. The method of claim 1 wherein the quantifying the computational error to generate the quantified computational error occurs in real time.

10. The method of claim 1 further comprises relaying a message encoded with the one or more user input parameters over the communication channel to the receiving terminal of the laser system.

11. The method of claim 10 further comprising adjusting the laser system components based on the one or more user input parameters.

12. The method of claim 1 wherein the laser beam propagates through a plurality of atmospheric conditions.

13. The method of claim 1 wherein the laser beam propagates through a plurality of points and planes.

14. The method of claim 1 wherein the choosing the one or more parameters for the laser system based on the prediction of the one or more laser beam parameters and based on the quantified computational error occurs in real time.

15. The method of claim 1 wherein the communication channel is a broad-band cable with modular and demodular equipment.

16. The method of claim 1 wherein the atmospheric condition includes a Greenwood frequency.

17. The method of claim 1 wherein the predetermined tolerance is a predetermined range of a laser spot size.

18. The method of claim 1 wherein the predetermined tolerance is a predetermined power range.

19. The method of claim 1 wherein the embedded control scheme includes a paraxial approximation.

20. The method of claim 1 wherein the embedded control scheme includes a scalar Fresnel diffraction integral.

* * * * *